US008990750B2

(12) United States Patent
Iyer et al.

(10) Patent No.: US 8,990,750 B2
(45) Date of Patent: Mar. 24, 2015

(54) NUMERICAL AREA RECOVERY

(71) Applicant: Synopsys, Inc., Mountain View, CA (US)

(72) Inventors: Mahesh A. Iyer, Fremont, CA (US); Amir H. Mottaez, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/954,927

(22) Filed: Jul. 30, 2013

(65) Prior Publication Data
US 2015/0040089 A1 Feb. 5, 2015

(51) Int. Cl.
*G06F 17/50* (2006.01)
*G06F 9/455* (2006.01)
*G06F 11/22* (2006.01)

(52) U.S. Cl.
CPC .................................. *G06F 17/5081* (2013.01)
USPC ............ 716/113; 716/108; 716/134; 716/135

(58) Field of Classification Search
CPC ............ G06F 17/5031; G06F 17/5036; G06F 17/5068; G06F 17/5022; G06F 17/505; G06F 17/5045; G06F 17/5054; G06F 17/5072; G06F 17/5077
USPC .................................. 716/108, 113, 134, 135
See application file for complete search history.

(56) References Cited

U.S. PATENT DOCUMENTS

| | | | | |
|---|---|---|---|---|
| 8,266,570 | B2 * | 9/2012 | Walker et al. | 716/135 |
| 8,707,242 | B2 * | 4/2014 | Mottaez et al. | 716/132 |
| 8,762,915 | B1 * | 6/2014 | Prabhakar et al. | 716/113 |
| 2005/0081175 | A1 * | 4/2005 | Scott et al. | 716/12 |
| 2009/0293033 | A1 * | 11/2009 | Ito | 716/6 |
| 2010/0146469 | A1 * | 6/2010 | Chowdhury | 716/10 |
| 2011/0191731 | A1 * | 8/2011 | Walker et al. | 716/108 |

* cited by examiner

*Primary Examiner* — Thuan Do
*Assistant Examiner* — Magid Dimyan
(74) *Attorney, Agent, or Firm* — Park, Vaughan, Fleming & Dowler LLP; Laxman Sahasrabbuddhe (57) ABSTRACT

Systems and techniques are described for performing area recovery on a circuit design. Some embodiments can select a gate for area recovery in accordance with a reverse-levelized processing order, wherein an output pin of a driver gate is electrically coupled to an input pin of the gate. Next, the embodiment can determine a maximum delay value from an input pin of the driver gate to an output pin of the gate that does not create new timing requirement violations or worsen existing timing requirement violations at any of the timing endpoints of the circuit design. The embodiment can then downsize the gate based on the maximum delay value, wherein said downsizing comprises inputting the maximum delay value in a closed-form expression. Timing margin computation can be used to ensure that timing violations are not worsened when the embodiment recovers area from non-timing-critical regions of the circuit design.

20 Claims, 5 Drawing Sheets

NUMERICAL AREA RECOVERY

BACKGROUND

1. Technical Field

This disclosure relates to electronic design automation (EDA). More specifically, this disclosure relates to numerical area recovery.

2. Related Art

The goal of circuit synthesis is to convert a high-level description of a circuit design into an implementation that meets a set of timing constraints, and at the same time optionally optimizes one or more metrics, such as area, leakage power, etc.

Some circuit synthesis approaches create an initial circuit design at a given abstraction level (e.g., a logical or physical design). Next, a cell is identified in the circuit design for optimization based on the metrics that are desired to be optimized. An optimal size for the identified cell is then determined by iteratively replacing the identified cell with functionally equivalent cells that have different sizes (this optimization process is also referred to as "sizing the cell," "sizing the gate," etc.). For each replacement cell size that is tried, the circuit synthesis approach updates timing information, and rejects cell sizes for which one or more timing constraints are violated. Specifically, during area recovery, conventional circuit synthesis tools use an iterative trial-and-error approach to downsize cells without degrading one or more timing metrics. The iterative optimization process typically terminates after the optimization process has executed for a certain number of iterations or for a certain amount of time. One aspect that further makes this process computationally expensive is that modern technology libraries have many sizes associated with each gate type with varying driving capability and/or multiple threshold voltages.

Unfortunately, such iterative trial-and-error based circuit synthesis approaches either take too long to complete and/or produce poor quality results for large circuit designs in which timing constraints are checked across many process corners and modes.

A circuit synthesis approach that is different from iterative trial-and-error approaches is described in Ivan Sutherland, Robert F. Sproull, and David Harris, *Logical Effort: Designing Fast CMOS Circuits*, Morgan Kaufmann, 1999 (hereinafter "Sutherland"). The cell delay can be represented using the following expression:

$$d = R \cdot C_o + p, \quad (1)$$

where, R is the output resistance of the cell, $C_o$ is the output loading, and p is the parasitic delay of the cell. Equation (1) can then be rewritten as:

$$d = (R \cdot C_i) \cdot \left(\frac{C_0}{C_i}\right) + p, \quad (2)$$

where, $C_i$ is the input capacitance presented by the cell at one of its input terminals.

The circuit synthesis approach described in Sutherland uses the following linear cell delay model:

$$d = g \cdot h + p, \quad (3)$$

where, g represents the logical effort, h represents the electrical effort, and p represents the parasitic delay of the cell. The logical effort captures the effect of the cell's topology on its ability to produce output current. The logical effort is independent of the size of the transistors in the circuit. The electrical effort describes how the electrical environment of the cell affects performance, and how the size of the transistors in the cell determines its load-driving capability. The parasitic delay is a form of delay overhead that accompanies any gate. The logical effort g and the parasitic delay p can be normalized, e.g., they can be normalized with respect to the logical effort and parasitic delay values, respectively, of a reference inverter.

Comparing Equations (2) and (3) we note that the first term $(R \cdot C_i)$ represents the logical effort g, and the second term $$\left(\frac{C_0}{C_i}\right)$$

represents the electrical effort h.

The delay model that is used by a circuit synthesis approach must be accurate, i.e., it must accurately model the actual cell delays. If the delay model is inaccurate, the circuit implementation produced by the circuit synthesis approach will likely contain many timing violations. In the above-mentioned work by Sutherland et al., the authors state that the linear delay model is approximate, i.e., it does not accurately model the actual cell delays.

One of the important problems in circuit synthesis is called the minim-area-under-delay-constraints problem. A technique for solving this problem involves a process called area recovery in which the circuit synthesis tool attempts to downsize gates (thereby reducing the area occupied by the gates) without violating any delay constraints. What are needed are systems and techniques for efficiently and accurately performing area recovery.

SUMMARY

Some embodiments described herein provide techniques and systems for performing numerical area recovery on a circuit design. Some embodiments can select a gate for area recovery in accordance with a reverse-levelized processing order. Within the current processing level, gates can be selected in decreasing order of timing margins at gate outputs.

Some embodiments can begin area recovery for the current processing level by propagating timing margins backward to outputs of optimizable gates in the current processing level. Next, the embodiment can determine a maximum delay value from an input pin of a driver gate to an output pin of an optimizable gate that does not create new timing requirement violations or worsen existing timing requirement violations at any of the timing endpoints of the circuit design (note that an output pin of the driver gate is electrically coupled to one or more input pins of the optimizable gate). The embodiment can then downsize the optimizable gate based on the determined maximum delay value.

In some embodiments, downsizing the optimizable gate can include: determining an optimal gate size by inputting the maximum delay value in a closed-form expression; and discretizing the gate by selecting a gate size from a technology library based on the optimal gate size. Once the optimizable gate has been downsized, the embodiments can incrementally propagate timing margins backward to the downsized gate's inputs.

In some embodiments, the closed-form expression uses a generic logical effort value and a generic parasitic delay value of the gate that is being optimized, a specific logical effort value and a specific parasitic delay value of the driver gate, wire resistance and capacitance values of a net that electrically connects the output of the driver gate with the input of the gate that is being optimized, and input capacitance values of load gates whose inputs are electrically coupled to the output of the driver gate via the net.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein. In this disclosure, when the term "and/or" is used with a list of entities, it refers to all possible combinations of the list of entities. For example, the phrase "X, Y, and/or Z" covers the following cases: (1) only X; (2) only Y; (3) only Z; (4) X and Y; (5) X and Z; (6) Y and Z; and (7) X, Y, and Z.

Overview of an Electronic Design Automation (EDA) Flow

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are illustrative purposes only and are not intended to limit the embodiments to the forms disclosed.

Some EDA software tools enable circuit designers to describe the functionality that they want to implement. These tools also enable circuit designers to perform what-if planning to refine functionality, check costs, etc. During logic design and functional verification, the HDL (hardware description language), e.g., SystemVerilog, code for modules in the system can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout (placement) and can be electrically coupled (routing).

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Numerical Synthesis

Figure 1:
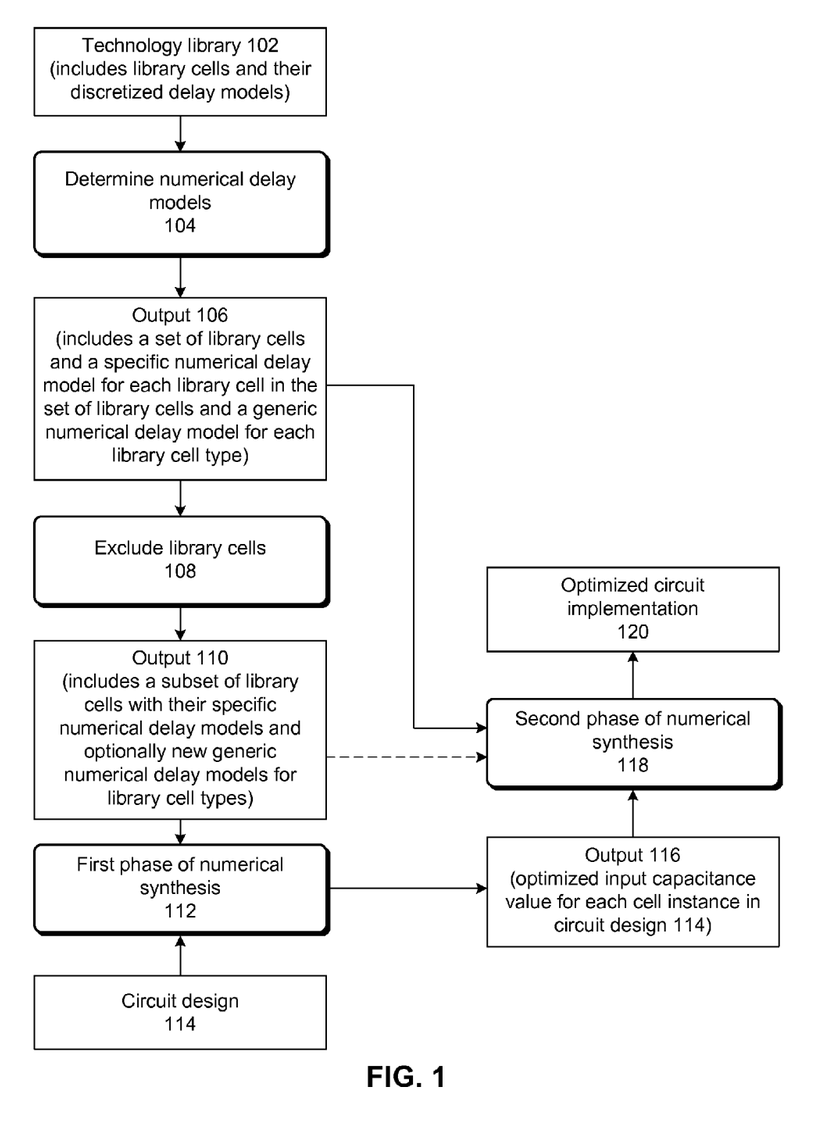
FIG. 1 illustrates a numerical synthesis process in accordance with some embodiments described herein.

FIG. 1 illustrates a numerical synthesis process in accordance with some embodiments described herein.

Technology library 102 includes library cells and discretized non-linear delay models for the library cells. The library cells in the technology library 102 can be used to create and/or optimize a circuit design. The term "library cell" refers to a cell in a technology library. The term "library cell" is to be distinguished from the term "cell instance" which is an instantiation of a library cell in a circuit design. In some embodiments, a discretized delay model models the delay for a timing arc of a library cell.

The term "library cell type" refers to a particular logical functionality. Examples of functionalities include, but are not limited to, "AND," "OR," "XOR," "multiplexor," etc. The term "library cell" refers to a particular implementation of a library cell type. A technology library can be viewed as a collection of library cells of one or more library cell types. For example, a technology library may include multiple sizes of an inverter. In this example, the term "inverter" is the library cell type, and the term "library cell" refers to an inverter implementation of a particular size.

A numerical delay model is a delay model that can be used by a numerical solver to optimize a cost function. A linear delay model is one example of a numerical delay model. More generally, an analytical formula that represents the delay behavior is an example of a numerical delay model.

The term "specific numerical delay model" refers to a numerical delay model that models the delay behavior of a particular timing arc of a particular library cell, or the delay behavior of a particular library cell. A specific numerical delay model is defined using a specific logical effort value and a specific parasitic delay value.

The term "generic numerical delay model" refers to a numerical delay model that models an aggregated delay behavior of either a timing arc of a library cell type or the library cell type itself. A generic numerical delay model is defined using a generic logical effort value and a generic parasitic delay value.

Examples of systems and techniques that can be used to determine specific and generic numerical delay models (which can be used to perform operation 104) are described in U.S. patent application Ser. No. 13/450,178, entitled "Numerical delay model for a technology library cell and/or a technology library cell type," the contents of which are herein incorporated by reference in their entirety.

Some embodiments determine numerical delay models based on technology library 102 (operation 104). Output 106 of operation 104 can include a set of library cells and a specific numerical delay model for each library cell in the set of library cells and a generic numerical delay model for each library cell type. The set of library cells in output 106 typically includes all library cells in technology library 102, but in some embodiments certain library cells may be removed if desired.

Certain library cells can then be excluded (operation 108) to obtain a subset of library cells. Each library cell in the subset of library cells has a specific numerical delay model that was computed in operation 104. In some embodiments, a new generic numerical delay model can be determined for each cell type based on the specific numerical delay models corresponding to the subset of library cells. These generic numerical delay models are "new" because they are based on the subset of library cells as opposed to being based on the set of library cells that were used in operation 104 to determine the generic numerical delay models. Output 110, i.e., the subset of library cells with their specific numerical delay models and optionally the new generic numerical delay models for the library cell types, can then be provided as input to the first phase of numerical synthesis 112.

Examples of systems and techniques that can be used to exclude library cells (which can be used to perform operation 108) are described in U.S. patent application Ser. No. 13/479,807, entitled "Excluding library cells for delay optimization in numerical synthesis," the contents of which are herein incorporated by reference in their entirety.

The first phase of numerical synthesis 112 sizes cells in circuit design 114 using the subset of library cells with their specific numerical delay models and the new generic numerical delay models. In some embodiments, the first phase of numerical synthesis 112 models a numerical optimization problem based on circuit design 114 and the specific and generic numerical models for the subset of library cells.

The numerical optimization problem that is modeled in the first phase of numerical synthesis 112 depends on the optimization goal. Specifically, some embodiments described herein create a closed-form expression to model the minimum-area-under-delay-constraints problem. The solution to the closed-form expression provides the optimal capacitance value for the cell instance that is being optimized.

Output 116 from the first phase of numerical synthesis 112 includes a numerically optimized size for one or more cell instances in circuit design 114. Specifically, in some embodiments, output 116 includes the numerically optimized (and desired) input capacitance value for one or more cell instances in the circuit design 114.

Output 116 is then provided as one of the inputs to the second phase of numerical synthesis 118. The other inputs to second phase of numerical synthesis 118 include the library cells in technology library 102 and output 106 which includes the numerical delay models that were generated by operation 104. The second phase of the numerical synthesis 118 then instantiates cells that have the numerically optimized and desired cell sizes in circuit design 114 to produce optimized circuit implementation 120 using the discrete library cells from the technology library. In particular, for each cell instance in circuit design 114, the second phase of numerical synthesis 118 selects a library cell that best matches the numerically optimized size, (if a library cell with exactly the optimized size is not available, a library cell with nearly the optimized size is selected) from the set of library cells that were part of output 106. In some embodiments, second phase of numerical synthesis 118 also receives output 110 as input (shown in FIG. 1 using a dashed line). Specifically, second phase of numerical synthesis 118 uses the fact that certain cells were excluded from output 106 to determine which cells to instantiate. If the user marks certain library cells as "do not use" cells, then the optimization process does not use them.

The reason a subset of library cells is used in the first phase and the set of all library cells is used in the second phase is as follows. The first phase determines numerically optimized cell sizes by solving a numerical optimization problem. In this phase, it is desirable to restrict the search space to library cells that can be accurately modeled using a logical effort and parasitic delay based numerical modeling approach. Therefore, a subset of library cells is used in this phase to restrict the search space. Once the numerically optimized cell sizes have been determined, it is important to enable the circuit synthesis process to select cell instances from a wide range of library cells. Therefore, in the second phase, the restriction on the search space is relaxed and the set of library cells that was in output 106 is used.

If multiple optimization iterations are being used, then the process can return to the first phase of numerical synthesis 112 and optimized circuit implementation 120 can be used as circuit design 114 in the next optimization iteration. For example, in some embodiments, each optimization iteration can optimize the size of one cell instance. In these embodiments, after the optimal capacitance value for the cell instance has been determined and discretized, the resulting optimized circuit implementation (e.g., optimized circuit implementation 120) can be used as the starting point (e.g., can be used as circuit design 114) in the next optimization iteration in which another cell instance is optimized.

In general, gates can be optimized in any arbitrary order. Some embodiments described herein optimize gates in a reverse-levelized order so that, when a current set of gates are being optimized, the loads on those gates can be modeled accurately as fixed loads because those loads would have already been optimized in the current iteration. In a reverse-levelized processing order, each logic gate is associated with a level so that each logic gate's level is greater than the highest level associated with logic gates that are electrically coupled to the logic gate's fan-in. Optimizing gates in reverse-levelized order means that the gates are optimized in decreasing order of their levels, i.e., a gate at level n−1 will only be optimized after all gates at level n have been optimized. Gates at the same level may be optimized in any arbitrary order.

Figure 2:
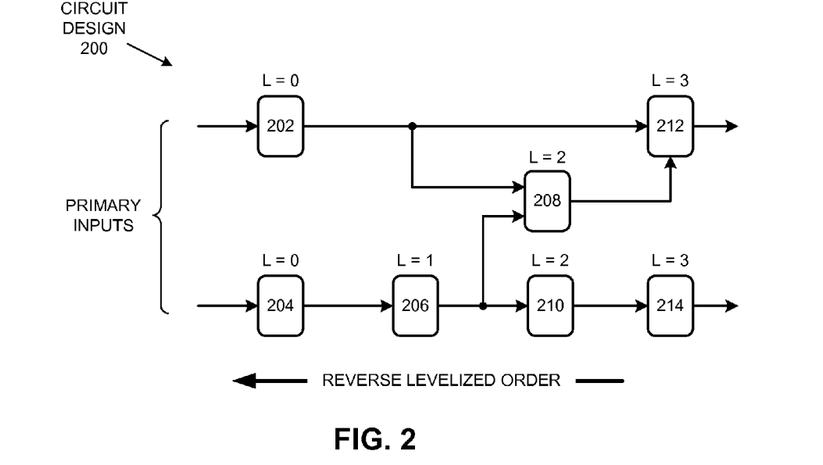
FIG. 2 illustrates a reverse-levelized processing order in accordance with some embodiments described herein.

FIG. 2 illustrates a reverse-levelized processing order in accordance with some embodiments described herein. In the figure, the notation "L=n," where n is a number denotes that the level associated with the logic gate is equal to n. Circuit design 200 includes logic gates 202-214 that have been assigned levels 0 through 3. Logic gates 202-204, whose fan-in is coupled to a primary input of the circuit design, are assigned level 0. All other logic gates are assigned a level that is greater than the highest level associated with the logic gates that are electrically coupled to the logic gate's fan-in. For example, logic gate 206 is assigned level 1, logic gates 208-210 are assigned level 2, and logic gates 212-214 are assigned level 3. In a reverse-levelized optimization order, the optimization process optimizes logic gates in decreasing order of their levels. For example, some embodiments described herein would optimize logic gates 212 and 214 before optimizing logic gates 208 and 210, and so forth.

Modeling the Minimum-Area-Under-Delay-Constraints Problem

Figure 3A:
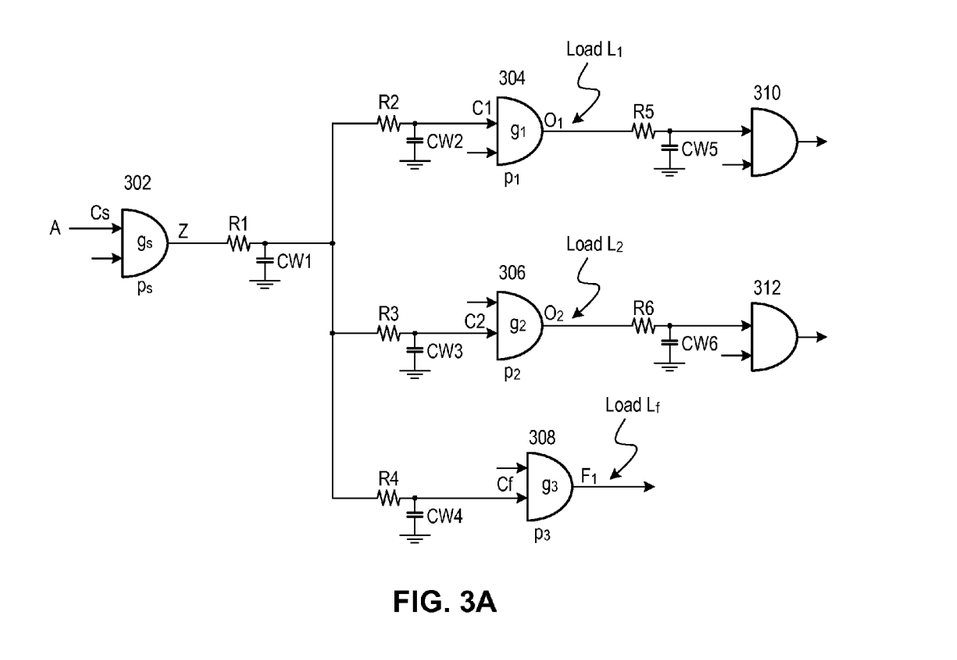
FIG. 3A how a gate optimization problem can be modeled in accordance with some embodiments described herein.

FIG. 3A how a gate optimization problem can be modeled in accordance with some embodiments described herein.

The portion of the circuit design shown in FIG. 3A includes gates 302-312. The gates shown in FIG. 3A can have any logic functionality, i.e., the gate symbols used in FIG. 3A do not necessarily correspond to a particular logic function. Furthermore, although only two inputs and one output is shown per gate in FIG. 3A, these gates can generally have one or more inputs and one or more outputs. The output of driver gate 302 is electrically connected to the inputs of gates 304-308. The outputs of gates 304 and 306 are electrically connected to the inputs of gates 310 and 312, respectively. The electrical behavior of the wires that electrically connect outputs and inputs is modeled using a network of resistances and capacitances as shown in FIG. 3A. For example, the electrical behavior of the wire that electrically connects the output of driver gate 302 with the inputs of gates 304-308 is modeled using a network of resistances R1-R4 and capacitances CW1-CW4. Likewise the electrical behavior of the wire that electrically connects the output of gate 304 with the input of gate 310 is modeled using resistance R5 and capacitance CW5, and the electrical behavior of the wire that electrically connects the output of gate 306 with the input of gate 312 is modeled using resistance R6 and capacitance CW6.

The input capacitances (i.e., of the inputs shown in FIG. 3A) of gates 302-308 are Cs, C1, C2, and Cf, respectively. The labels $O_1$, $O_2$, and $F_1$ correspond to the output pins of gates 304, 306, and 308, respectively. The loads at $O_1$, $O_2$, and $F_1$, are $L_1$, $L_2$, and $L_f$, respectively. The generic logical effort values for gates 304 and 306 are $g_1$ and $g_2$, respectively. The generic parasitic delay values for gates 304 and 306 are $p_1$ and $p_2$, respectively. The specific logical effort and parasitic delay values for gate 302 are $g_s$ and $p_s$, respectively. The specific logical effort and parasitic delay values for gate 308 are $g_3$ and $p_3$, respectively.

Delays from pin A to output pins $O_1$, $O_2$, and $F_1$, are modeled as follows. Let the wire delays from pin Z to pins $O_1$, $O_2$, and $F_1$, be dw1, dw2, and dw3. The wire delays dw1, dw2, and dw3 can be modeled using an Elmore delay model. Systems and techniques for efficiently computing Elmore wire delay are described in U.S. patent application Ser. No. 13/485,600, entitled "Incremental Elmore delay calculation," the contents of which are herein incorporated by reference in their entirety. Specifically, let CWT=CW1+CW2+CW3+CW4. Delay dw1 can be modeled as dw1=τ1+B11·C1+B12·C2, where, $$τ1 = R1·(CWT+Cf)+R2·CW2,$$

$$B11=(R1+R2),$$

and $$B12=R1. \quad (4)$$

Likewise, delays dw2 and dw3 can be modeled as dw2=τ2+B21·C1+B22·C2 and dw3=τ3+B31·C1+B32·C2, respectively, where, $$τ2=R1·(CWT+Cf)+R3·CW3,$$

$$B21=R1,$$

$$B22=R1+R3,$$

$$τ3=R1·(CWT+Cf)+R4·(CW4+Cf),$$

$$B31=R1,$$

and $$B32=R2. \quad (5)$$

Let the delays from pin A to output pins $O_1$, $O_2$, and $F_1$, be $f_1$, $f_2$, and $f_3$, respectively. Delay $f_1$ can be expressed as follows:

$$f_1 = \frac{g_s}{C_s}·(CWT+C1+C2+Cf)+p_s+dw1+\frac{g_1}{C1}·L_1+p_1 = \quad (6)$$

$$\frac{g_s}{C_s}·(CWT+Cf)+τ1+p_s+p_1+$$

$$\left(\frac{g_s}{C_s}+B11\right)·C1+\left(\frac{g_s}{C_s}+B12\right)·C2+\frac{g_1·L_1}{C1}.$$

Equation (6) can be rewritten as:

$$f_1 = K1+A11·C1+A12·C2+\frac{\phi 1}{C1}, \quad (7)$$

where, $$K1 = \frac{g_s}{C_s}·(CWT+Cf)+τ1+p_s+p_1, \quad (8)$$

$$A11 = \frac{g_s}{C_s}+B11,$$

$$A12 = \frac{g_s}{C_s}+B12, \text{ and}$$

$$\phi 1 = g_1·L_1.$$

Likewise, $f_2$ can be expressed as follows:

$$f_2 = K2+A21·C1+A22·C2+\frac{\phi 2}{C2}, \quad (9)$$

where, $$K2 = \frac{g_s}{C_s}·(CWT+C_f)+τ2+p_s+p_2, \quad (10)$$

$$A21 = \frac{g_s}{C_s}+B21,$$

$$A22 = \frac{g_s}{C_s}+B22, \text{ and}$$

$$\phi 2 = g_2·L_2,$$

and, $f_3$ can be expressed as follows:

$$f_3=K3+A31·C1+A32·C2, \quad (11)$$

where, $$K3 = \frac{g_s}{C_s}·(CWT+Cf)+τ3+\frac{g_3·L_f}{Cf}p_s+p_3, \quad (12)$$

$$A31 = \frac{g_s}{C_s}+B31, \text{ and}$$

$$A32 = \frac{g_s}{C_s}+B32.$$

Let D1, D2, and D3 be the desired delays from pin A to pins $O_1$, $O_2$, and $F_1$, respectively. The objective function $f_c$ for the minimum-area-under-delay-constraints problem can be defined as follows:

$$f_c=\max[(f_1-D1),(f_2-D2),(f_3-D3)], \quad (13)$$

where, "max" is a function that outputs the maximum value from the set of values that are provided as arguments to the function.

In some embodiments, the gates are optimized one at a time. In these embodiments, a closed-form expression can be derived for optimizing the gates. An important insight that allows us to use a closed-form expression to perform area recovery is the following: when an optimizable gate is downsized, the delay computation of non-optimizable branches can be ignored. Note that, when we downsize the optimizable gate, the delay of the non-optimizable branches can only improve because the source gate delay and other wire delays will only improve. For example, when gate 304 is downsized in FIG. 3A, we know that the delay from the input of source gate 302 to the inputs of gates 306 and 308 will not degrade, and therefore the delay calculation for these non-otpimizable branches can be ignored. A derivation of the closed-form expression is now presented. Assume that gate 304 is the optimizable gate for area recovery, and gates 306 and 308 are treated as fixed (non-optimizable) gates when gate 304 is being optimized. This means that C2 and Cf are fixed capacitances when determining the value of C1 using numerical area recovery.

Equations (7)-(8) can be rewritten as follows:

$$M = A11 \cdot C1 + \frac{\phi 1}{C1}, \quad (14)$$

where, $M = f_1 - K1 - A12 \cdot C2$. By multiplying both sides by C1, Equation (14) can be converted into a quadratic equation as follows:

$$A11 \cdot (C1)^2 - M \cdot C1 + \phi 1 = 0. \quad (15)$$

The solutions to this quadratic equation can be expressed as follows:

$$C1 = \frac{M \pm \sqrt{M^2 - 4 \cdot A11 \cdot \phi 1}}{2 \cdot A11}. \quad (16)$$

Suppose a value of $f_1$ is computed as the desired delay from pin A to pin O1 (and therefore the value of M is known). Now, if the value of $M^2 - 4 \cdot A11 \cdot \phi 1$ is negative, then there is no real valued solution to the quadratic Equation (16). In other words, there is no input capacitance value that will result in a delay value of $f_1$ as computed by Equation (7). On the other hand, if the value of $M^2 - 4 \cdot A11 \cdot \phi 1$ is positive, then there are two real solutions to the quadratic Equation (16). Of these two real solutions, the smallest positive solution corresponds to the smallest cell area for gate 304 that will result in a delay value of $f_1$ as computed by Equation (7).

Note that, if the value of $f_1$ is set to be equal to the maximum amount of delay from pin A to output pin $O_1$ (see FIG. 3A) that does not create new timing requirement violations or worsen existing timing requirement violations at any of the timing endpoints, then the resulting capacitance value C1 that is computed using Equation (16) will correspond to the smallest area of gate 304 that does not create new timing requirement violations or worsen existing timing requirement violations at any of the timing endpoints. This is another important insight that allows us to use a closed-form expression to determine the optimal gate size for the minimum-area-under-delay-constraints problem. Similarly, a closed-form expression can be derived for optimizing the size of gate 306 (i.e., for computing an optimal value of C2), or generally for optimizing (i.e., in the context of area recovery) any gate that is being driven by a source gate.

Figure 3B:
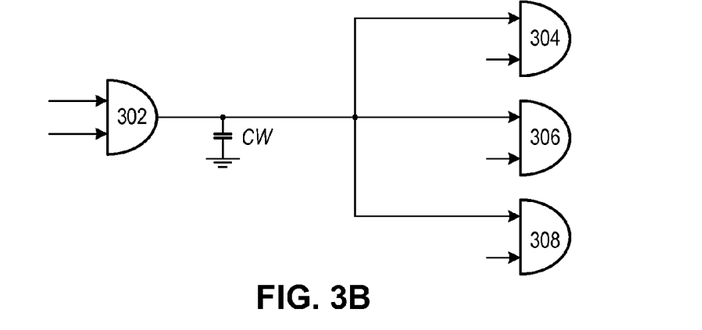
FIGS. 3B-3D illustrate a best case wire load model, a worst case wire load model, and a balanced-tree wire load model, respectively, in accordance with some embodiments described herein.
Figure 3C:
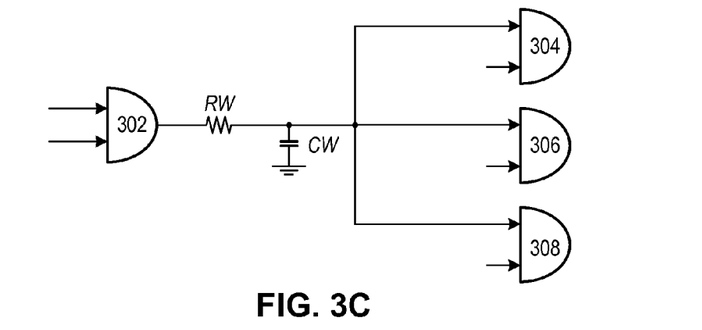
Figure 3D:
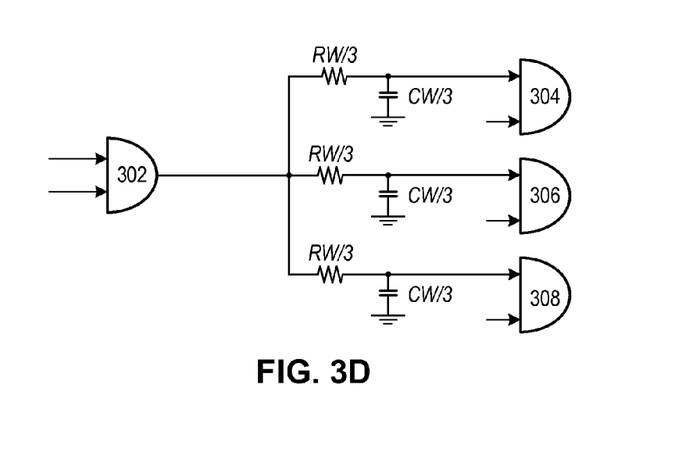

Although some embodiments described herein use the Elmore wire load model, the systems and techniques described in this disclosure can generally be applied to any wire load model. Specifically, the systems and techniques described herein can use a best case wire load model (which is a model that ignores the wire resistance and models the wire load using a single lumped capacitance), a worst case wire load model (which is a model that uses a lumped resistance and a lumped capacitance to model the wire load), and a balanced-tree wire load model (which is a model that distributes the total capacitance and resistance of the wire equally across each branch, and uses a lumped capacitance and lumped resistance to model the wire load of each branch). FIGS. 3B-3D illustrate a best case wire load model, a worst case wire load model, and a balanced-tree wire load model, respectively, in accordance with some embodiments described herein. In FIGS. 3B-3D, RW is the wire resistance and the CW is the wire capacitance. The derivations for the closed-form expressions for the wire load models illustrated in FIGS. 3B-3D are special cases of the above-described derivation of the closed-form expression for the Elmore wire load model.

Figure 4:
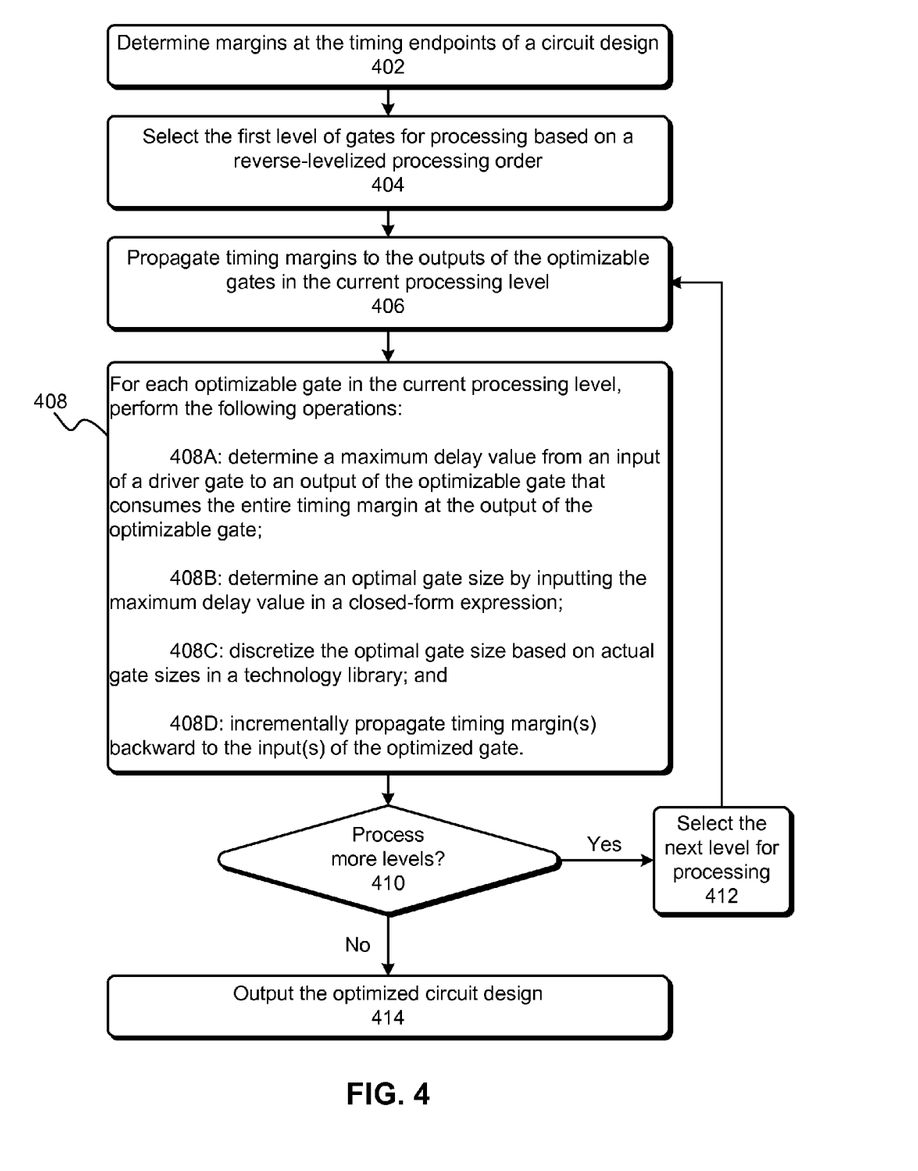
FIG. 4 illustrates a process for optimizing a circuit design in accordance with some embodiments described herein.

FIG. 4 illustrates a process for optimizing a circuit design in accordance with some embodiments described herein. An embodiment (e.g., a computer system) can perform the process, which begins by determining margins at the timing endpoints of a circuit design (operation 402). The circuit design can generally be at any abstraction level, e.g., the circuit design can be a logical design or a physical design.

According to one definition, a timing margin at a pin in the circuit design is the maximum amount of timing degradation that can be experienced at the pin without creating new timing requirement violations or worsening existing timing requirement violations at any of the timing endpoints. Systems and techniques for computing and using timing margins are described in U.S. patent application Ser. No. 12/783,915, entitled "Global timing modeling within a local context," by inventors Mahesh A. Iyer, Amir H. Mottaez, and Rajnish K. Prasad, which was filed on 20 May 2010, and which is herein incorporated by reference in its entirety.

Next, the embodiment begins processing gates in the circuit design in a reverse-levelized processing order. Specifically, the embodiment can select the first level of gates for processing based on the reverse-levelized processing order (operation 404). FIG. 2 and the associated text teaches how gates can be processed in a reverse-levelized processing order. Note that the first level of gates that are processed in the reverse-levelized processing order corresponds to level L=3, i.e., logic gates 212 and 214 in FIG. 2. The embodiment can then propagate timing margins to the outputs of the optimizable gates in the current processing level (operation 406). For example, in FIG. 2, the timing margins may be propagated back from the timing endpoints to the outputs of logic gates 212 and 214.

Next, the embodiment can perform a sequence of operations for each optimizable gate in the current level (operation 408). Specifically, the sequence of operations can begin by determining a maximum delay value from an input of a driver gate to an output of the optimizable gate that consumes the entire timing margin at the output of the optimizable gate (operation 408A). For example, while optimizing gate 304 in FIG. 3A, the embodiment can determine the maximum delay value from input pin A of gate 302 to output pin $O_1$ of gate 304 that consumes the entire timing margin at output pin $O_1$ of gate 304. Specifically, the maximum delay value can be computed as follows. Let $a_s$ be the arrival time at input pin A of gate 302 and let $a_1$ be the arrival time at output pin $O_1$ of gate

304. Let the minimum timing margin at output pin $O_1$ of gate 304 be $t_{m1}$. Now, the maximum delay value $R_1$ from input pin A of gate 302 to output pin $O_1$ of gate 304 that does not create new timing requirement violations or worsen existing timing requirement violations at any of the timing endpoints can be computed using the following expression:

$$R_1 = (a_1 + t_{m1}) - a_s \quad (17)$$

Next, the embodiment can determine an optimal gate size by inputting the maximum delay value in a closed-form expression (Equation 16 and operation 408B). Operation 408B can involve constructing the closed-form expression (e.g., the closed-form expression on the right hand side of Equation (16)) and collecting (e.g., by retrieving values stored in memory locations) information that is required for evaluating the closed-form expression. Specifically, the collected circuit information can include the maximum delay value $R_1$ that was computed in Equation (17). The value of $R_1$ can be inputted into the variable $f_1$ when the right hand side of Equation (16) is evaluated (note that $f_1$ is one of the terms in the expression for M). Other circuit information that may be collected can include the generic logical effort value of the optimizable gate, an input capacitance value and a specific logical effort value of the driver gate, and wire resistance and capacitance values of the net that electrically connects the output of the driver gate with the input of the optimizable gate. Some or all parts of the "collecting information" operation and/or the "constructing the closed-form expression" operation can be performed once and then reused later.

The embodiment can then discretize the optimal size based on actual gate sizes in a technology library (operation 408C). Discretization can involve identifying a cell in the technology library that does not create new timing requirement violations or worsen existing timing requirement violations at any of the timing endpoints, and whose input capacitance value is nearest to the optimal input capacitance value that was determined in operation 408B.

Note that the embodiments discretize the gate that is currently being optimized before proceeding to the next optimizable gate. The reason for doing this is that the timing margin available on the output of the optimizable gate may not be fully consumed after discretization. After discretization, the embodiment can incrementally propagate margin value(s) backward to the input(s) of the optimized gate (operation 408D). Systems and techniques for incrementally propagating margin values are described in U.S. patent application Ser. No. 13/482,855, entitled "Delta-slack propagation for circuit optimization," by inventors Mahesh A. Iyer and Robert L. Walker, which was filed on 29 May 2012, and which is herein incorporated by reference in its entirety.

Once all of the optimizable gates in the current level have been optimized, the embodiment can check if more levels are to be processed (operation 410). If more levels are to be processed ("Yes" branch), then the embodiment can select the next level for processing (operation 412) and return to operation 406. On the other hand, if all levels have been processed ("No" branch), then the embodiment can output the optimized circuit design (operation 414).

In operation 408, the gates within a given level can be processed in decreasing order of the timing margins at the gates' outputs. Specifically, the following pseudo-code provides one example of how gates within a given level can be processed from the largest timing margin to the smallest timing margin.

```
for each optimizable gate in the current level {
  for each input pin of the optimizable gate {
    let opt_net be the net of the input pin;
    for each load of opt_net {
      if (load is not optimizable) continue;
      (worst_output, margin) = get_load_pin_margin(load);
      array_insert(load_array, {load, worst_output, margin})
    }
    array_sort(load_array, max margin to min margin)
    for each (load, worst_output, margin) in the sorted load_array {
      determine the optimal gate size using the closed-form expression;
      discretize the optimal gate size;
    }
  }
}
```

In the above pseudo-code, the function "get_load_pin_margin" receives the "load" (e.g., an identifier associated with a particular load) as input, and returns the "worst_output" and "margin" values as output (an example pseudo-code for the function "get_load_pin_margin" is shown below). The "worst_output" value identifies the output of the load that has the worst timing margin value, and the "margin" value is this worst timing margin value. The function "array_insert" inserts that triplet "{load, worst_output, margin}" into an array called "load_array" that was specified as an argument to the function. The function "array_sort" sorts the array specified in one of the arguments based one or more fields in the array. In the above pseudo-code, the function "array_sort" is invoked to sort the array from the maximum margin value to the minimum timing margin value. In other words, after the function "array_sort" returns, the first element in the array "load_array" will correspond to the load that has the maximum timing margin on its output, and the last element in the array will correspond to the load that has the minimum timing margin on its output.

The following pseudo-code provides an example of an implementation of function "get_load_pin_margin." The term "sink pin" corresponds to an output pin of the load, and the term "load" refers to the input pin of the optimizable gate that is driven by the source driver gate.

```
get_load_pin_margin(load) {
  margin = infinity; worst_output = NIL;
  for each sink pin of load;
  if sink net is unconstrained, sink_margin = infinity;
  if (sink_margin < margin) {
    margin = sink_margin;
    worst_output = sink_pin;
  }
  return (worst_output, margin);
}
```

Note that the closed-form expression can be solved for different inputs of an optimizable gate. Each application of the closed-form expression may return a different optimal gate size. In some embodiments, when multiple inputs of an optimizable gate are discretized, the embodiment can select the optimal gate size that produces the best delay because it is important to ensure that the gate is not over-downsized thereby violating a timing requirement for some other input of the optimizable gate. Specifically, the following pseudo-code provides one example of how an optimizable gate can be discretized when multiple inputs of the optimizable gate return different optimal gate sizes.

As mentioned above, the timing margins can be incrementally propagated in operation 408D using the systems and techniques described in U.S. patent application Ser. No. 13/482,855. The following pseudo-code provides another example of a process that can be used to incrementally propagate timing margins.

update timing from source gate to the output of the optimizable gate;

when the timing at the optimizable gate's output pin is updated, we store a set of arrival triplets of values {input pin, arrival at this input pin, arrival at the output pin caused by this input pin}, and another triplet of values {input pin that produced the worst arrival at the output pin, worst input's arrival time, worst arrival time at the output pin};

compute a new output margin at the optimizable gate's output pin as follows: new_margin = old_margin − (worst output arrival time in the stored triplets − old output arrival time);

compute new input margins as follows: for each triplet in the set of arrival triplets { new input margin=new_margin + (worst input's arrival − input pin arrival);

/* Note that this step ensures that the new input margin on the input that produced the worst arrival at the output would be new_margin. */
}

Figure 5:
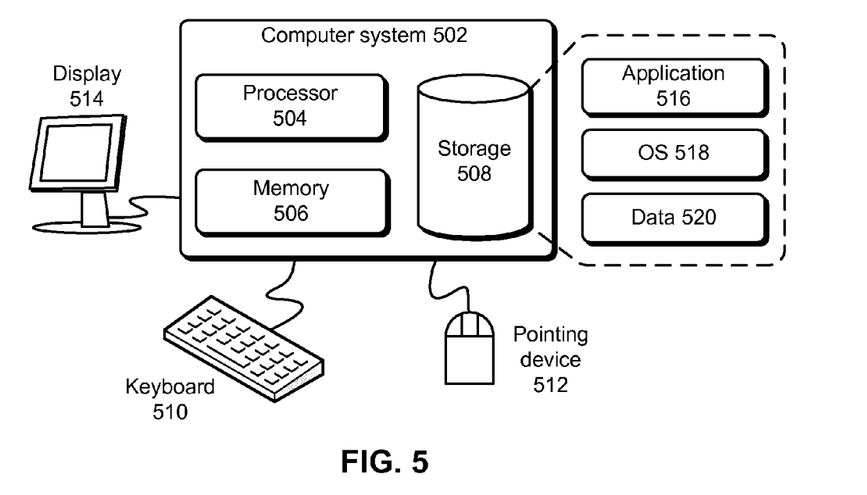
FIG. 5 illustrates a computer system in accordance with an embodiment of the present invention.

FIG. 5 illustrates a computer system in accordance with an embodiment of the present invention. A computer system can generally be any system that can perform computations. Specifically, a computer system can be a microprocessor, an application specific integrated circuit, a distributed computing system, a cloud computing system, or any other computing system now known or later developed. Computer system 502 comprises processor 504, memory 506, and storage 508. Computer system 502 can be coupled with display 514, keyboard 510, and pointing device 512. Storage 508 can generally be any device that can store data. Specifically, a storage device can be a magnetic, an optical, or a magneto-optical storage device, or it can be based on flash memory and/or battery-backed up memory. Storage 508 can store application 516, operating system 518, and data 520.

Application 516 can include instructions that when executed by computer 502 cause computer 502 to perform one or more processes that are implicitly or explicitly described in this disclosure. Data 520 can include any data that is inputted into or outputted by application 516.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for performing area recovery on a circuit design, the method comprising:
    selecting a gate for area recovery, wherein an output of a driver gate is electrically coupled to an input of the gate;
    determining a maximum delay value from an input pin of the driver gate to an output pin of the gate that does not create new timing requirement violations or worsen existing timing requirement violations at any of the timing endpoints of the circuit design; and
    downsizing, by using a computer, the gate based on the maximum delay value, wherein said downsizing comprises inputting the maximum delay value in a closed-form expression.

2. The method of claim 1, wherein said selecting the gate for area recovery involves selecting gates according to a reverse-levelized processing order.

3. The method of claim 2, wherein for a current processing level in the reverse-levelized processing order, the method further comprises propagating timing margins backward to outputs of optimizable gates of the current processing level.

4. The method of claim 3, wherein within the current processing level, gates are selected in decreasing order of timing margins at gate outputs.

5. The method of claim 1, wherein said downsizing the gate involves:
    determining an optimal gate size by inputting the maximum delay value in the closed-form expression;
    selecting a gate size from a technology library based on the optimal gate size; and
    incrementally propagating timing margins backward to the downsized gate's inputs.

6. The method of claim 5, wherein the method further comprises:
    incrementally propagating timing margins backward to the downsized gate's inputs, wherein said propagating includes: computing a new output pin margin based on an old output pin margin value and a difference between a worst arrival time and an old arrival time, and computing a new input pin margin based on the new output pin margin and a difference between a worst input's arrival time and an arrival time at the input pin.

7. The method of claim 1, wherein said closed-form expression uses a generic logical effort value and a generic parasitic delay value of the gate that is being optimized, a specific logical effort value and a specific parasitic delay value of the driver gate, wire resistance and capacitance values of a net that electrically connects the output of the driver gate with the input of the gate that is being optimized, and input capacitance values of load gates whose inputs are electrically coupled to the output of the driver gate via the net; and wherein a smallest positive solution generated by the closed-form expression is used for said downsizing the gate.

8. A non-transitory computer-readable storage medium storing instructions that, when executed by a computer, cause the computer to perform a method for performing area recovery on a circuit design, the method comprising:

selecting a gate for area recovery, wherein an output of a driver gate is electrically coupled to an input of the gate;

determining a maximum delay value from an input pin of the driver gate to an output pin of the gate that does not create new timing requirement violations or worsen existing timing requirement violations at any of the timing endpoints of the circuit design; and downsizing the gate based on the maximum delay value, wherein said downsizing comprises inputting the maximum delay value in a closed-form expression.

9. The non-transitory computer-readable storage medium of claim 8, wherein said selecting the gate for area recovery involves selecting gates according to a reverse-levelized processing order.

10. The non-transitory computer-readable storage medium of claim 9, wherein for a current processing level in the reverse-levelized processing order, the method further comprises propagating timing margins backward to outputs of optimizable gates of the current processing level.

11. The non-transitory computer-readable storage medium of claim 10, wherein within the current processing level, gates are selected in decreasing order of timing margins at gate outputs.

12. The non-transitory computer-readable storage medium of claim 8, wherein said downsizing the gate involves:

determining an optimal gate size by inputting the maximum delay value in the closed-form expression; and selecting a gate size from a technology library based on the optimal gate size.

13. The non-transitory computer-readable storage medium of claim 12, wherein the method further comprises:

incrementally propagating timing margins backward to the downsized gate's inputs, wherein said propagating includes: computing a new output pin margin based on an old output pin margin value and a difference between a worst arrival time and an old arrival time, and computing a new input pin margin based on the new output pin margin and a difference between a worst input's arrival time and an arrival time at the input pin.

14. The non-transitory computer-readable storage medium of claim 8, wherein said closed-form expression uses a generic logical effort value and a generic parasitic delay value of the gate that is being optimized, a specific logical effort value and a specific parasitic delay value of the driver gate, wire resistance and capacitance values of a net that electrically connects the output of the driver gate with the input of the gate that is being optimized, and input capacitance values of load gates whose inputs are electrically coupled to the output of the driver gate via the net; and wherein a smallest positive solution generated by the closed-form expression is used for said downsizing the gate.

15. An apparatus, comprising:

a processor; and a non-transitory computer-readable storage medium storing instructions that, when executed by the processor, cause the apparatus to perform a method for performing area recovery on a circuit design, the method comprising:

selecting a gate for area recovery, wherein an output of a driver gate is electrically coupled to an input of the gate;

determining a maximum delay value from an input pin of the driver gate to an output pin of the gate that does not create new timing requirement violations or worsen existing timing requirement violations at any of the timing endpoints of the circuit design; and downsizing the gate based on the maximum delay value, wherein said downsizing comprises inputting the maximum delay value in a closed-form expression.

16. The apparatus of claim 15, wherein said selecting the gate for area recovery involves selecting gates according to a reverse-levelized processing order.

17. The apparatus of claim 16, wherein for a current processing level in the reverse-levelized processing order, the method further comprises propagating timing margins backward to outputs of optimizable gates of the current processing level.

18. The apparatus of claim 17, wherein within the current processing level, gates are selected in decreasing order of timing margins at gate outputs.

19. The apparatus of claim 15, wherein said downsizing the gate involves:

determining an optimal gate size by inputting the maximum delay value in the closed-form expression; and selecting a gate size from a technology library based on the optimal gate size.

20. The apparatus of claim 19, wherein the method further comprises:

incrementally propagating timing margins backward to the downsized gate's inputs, wherein said propagating includes: computing a new output pin margin based on an old output pin margin value and a difference between a worst arrival time and an old arrival time, and computing a new input pin margin based on the new output pin margin and a difference between a worst input's arrival time and an arrival time at the input pin.

* * * * *